United States Patent [19]

Sevastopoulos et al.

[11] Patent Number: 4,988,952

[45] Date of Patent: Jan. 29, 1991

[54] HIGH Q SWITCHED CAPACITOR FILTER HAVING INTERNAL THIN-FILM RESISTORS

[75] Inventors: Nello G. Sevastopoulos; Robert C. Dobkin, both of San Jose, Calif.

[73] Assignee: Linear Technology Corporation, Milpitas, Calif.

[21] Appl. No.: 362,144

[22] Filed: Jun. 6, 1989

[51] Int. Cl.$^5$ ............................................. H03F 1/34
[52] U.S. Cl. ..................................... 330/51; 330/107; 330/307
[58] Field of Search ................... 330/9, 51, 107, 307; 328/167; 333/173

[56] References Cited

U.S. PATENT DOCUMENTS

| | | | |
|---|---|---|---|
| 3,535,646 | 10/1970 | Quinn | 330/9 X |
| 4,195,266 | 3/1980 | Bingham | 330/9 |
| 4,375,625 | 3/1983 | Lee | 330/107 X |
| 4,417,214 | 11/1983 | Sevastopoulos et al. | 330/84 |
| 4,769,612 | 9/1988 | Tamakoshi et al. | 328/167 |

OTHER PUBLICATIONS

Linear Technology Specification for LTC 1060 Dual Filter (1986).
Linear Technology Specification for LTC 1064 Quad Universal Filter (1989).

Primary Examiner—James B. Mullins
Attorney, Agent, or Firm—Flehr, Hohbach, Test, Albritton & Herbert

[57] ABSTRACT

Disclosed is a switched capacitor filter block having a nonlinear quality coefficient, Q, whereby quality can be enhanced while limiting the size of feedback resistors in the filter block. A pair of capacitors alternately switchably connect an input signal to the input of integrator whereby the sampling frequency is twice the switching frequency. The filter block is readily fabricated in a monolithic integrated circuit with the feedback resistors being thin-film resistors formed on the surface of the monolithic integrated circuit. Such a circuit configuration is more accurate in programming and requires only one mask step in fabrication to program.

9 Claims, 6 Drawing Sheets

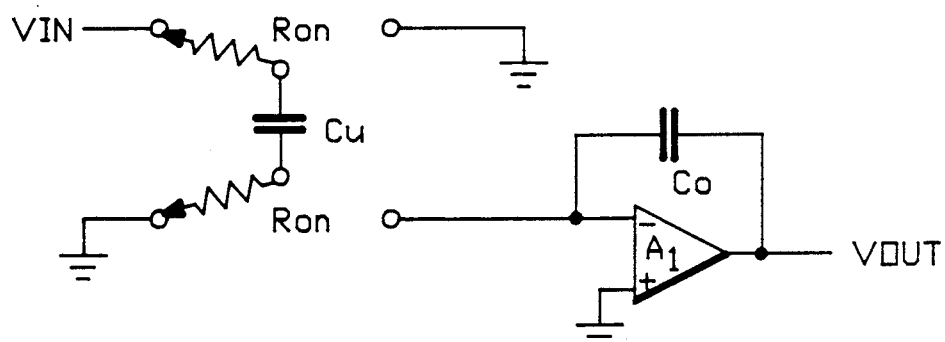
( PRIOR ART )
FIG.—4
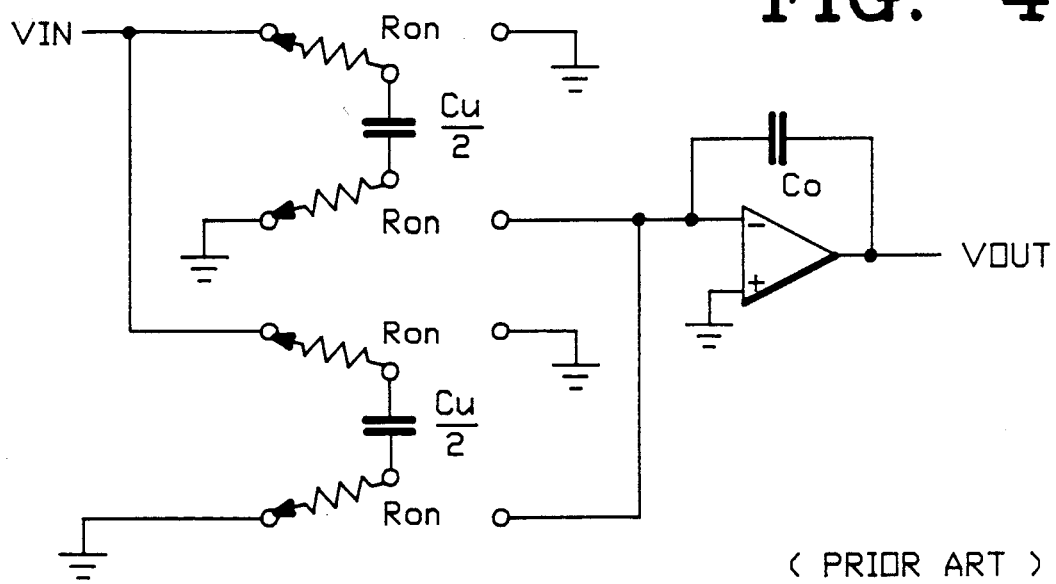
( PRIOR ART )
FIG.—5
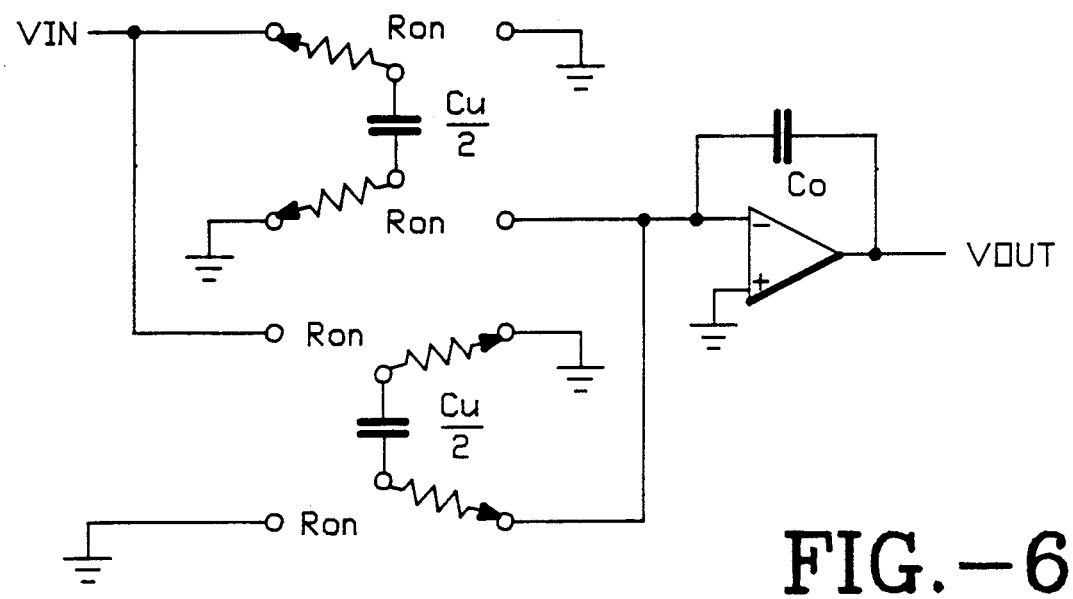
FIG.—6

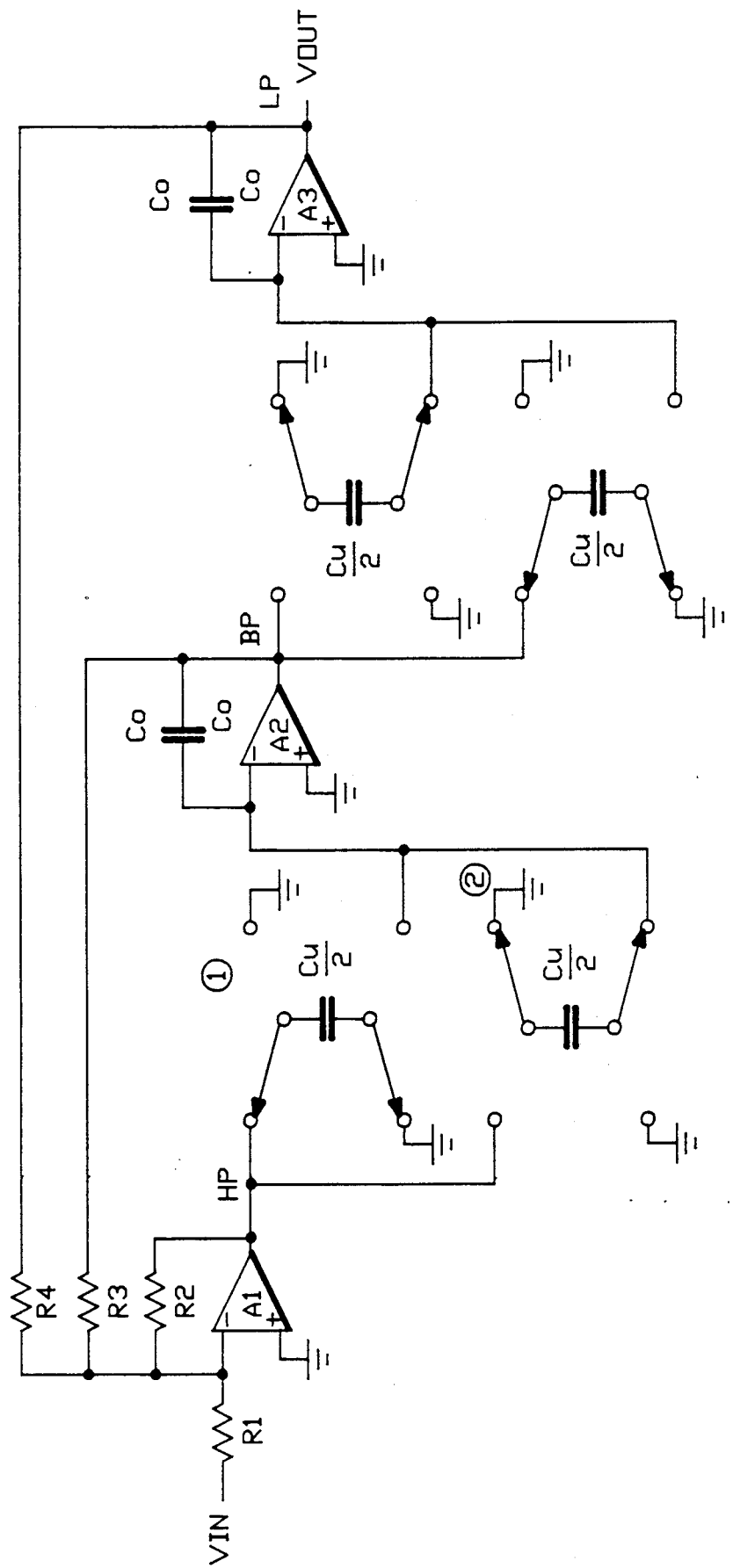
FIG.—7

FIG.—9

QUAD AMPIC

HIGH Q SWITCHED CAPACITOR FILTER HAVING INTERNAL THIN-FILM RESISTORS

BACKGROUND OF THE INVENTION

This invention relates generally to switched capacitor active filters, and more particularly the invention relates to a switched capacitor filter having nonlinear quality coefficient (Q) which permits quality enhancement.

U.S Pat. No. 4,417,214 for "Monolithic IC General Purpose Active Filter" discloses a switched capacitor simulation of an active R-C universal filter. The basic R-C active filter is a hybrid circuit in which three op amps are serially connected as a summer followed by two negative integrators. Four external discrete resistors are user-selected to configure the filter, while three hybrid thin-film resistors and two discrete capacitors, all mounted on a ceramic substrate, establish operating performance of the filter.

The switched capacitor filter simulation eliminates the necessity for using the hybrid resistors and capacitors through use of switched capacitor positive integrators. The filter can be fabricated in a single integrated circuit and experiences a linear quality coefficient, Q. However, the switched capacitors do induce noise in the filter. Further, external resistors are still employed for filter configuration, and the external resistors introduce parasitic capacitance and are limited in tuning accuracy.

SUMMARY OF THE INVENTION

An object of the present invention is an improved switched capacitor filter.

Another object of the invention is a switched capacitor filter having a nonlinear quality coefficient, Q.

Yet another object of the invention is a switched capacitor filter having a higher sampling rate.

A feature of the invention is a monolithic integrated circuit filter with the use of thin-film resistors on the surface of the monolithic IC chip.

Another feature of the invention is positive feedback from switched capacitors of the filter which make the quality, Q, nonlinear.

Briefly, in one embodiment of the invention, a filter block includes a summer and two positive integrators. The inputs to the integrators each comprise a pair of switched capacitors operating alternately in capacitively switching input to the integrator and thereby providing a double sampling mode of operation. The double sampling in conjunction with the multiple feedback paths leads to the nonlinear relationship of the qualify coefficient, Q, with respect to the values of the resistive feedback paths.

The invention and objects and features thereof will be more readily apparent from the following detailed description and appended claims when taken with the drawing.

BRIEF DESCRIPTION OF THE DRAWINGS

FIG. 4 is a schematic of a switched capacitor input to the positive integrators of the circuits of FIGS. 2 and 3.

FIG. 5 is equivalent to the circuit of FIG. 4 but in which the switched capacitor is replaced by two switched capacitors connected in parallel.

FIG. 6 is a schematic of a switched capacitor input in accordance with the present invention.

FIG. 7 is a schematic of a switched capacitor universal filter block in accordance with one embodiment of the present invention.

DETAILED DESCRIPTION OF ILLUSTRATIVE EMBODIMENTS

Figure 1:
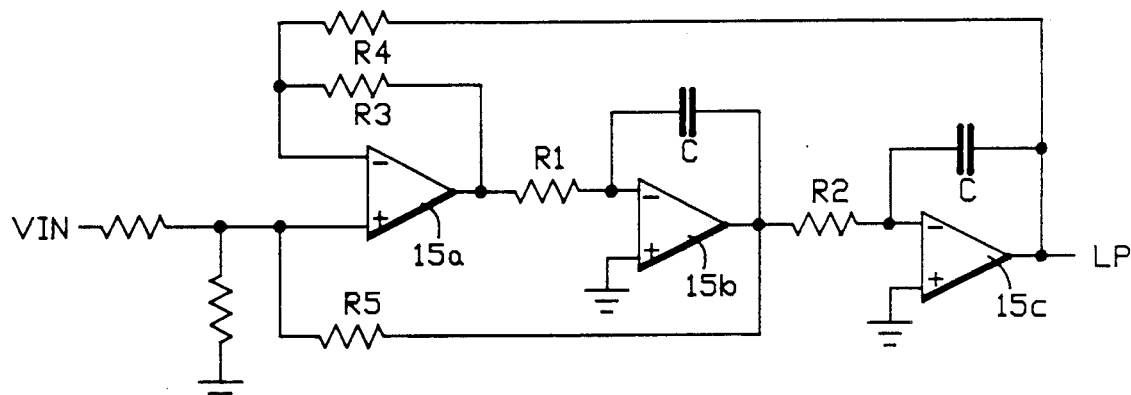
FIG. 1 is a schematic of a basic R-C active filter in accordance with the prior art.

Referring now to the drawing, FIG. 1 is a schematic of a universal state variable R-C filter as disclosed in U.S. Pat. No. 4,417,214, supra. The filter includes three op amps 15A, 15B, 15C with op out 15A utilized as a summer while the op amps 15B and 15C function as negative integrators. The resistors R1, R2, R6 and R7 are external resistors selected by the user to configure the filter in the desired manner. The resistors R3, R4, and R5 are thin-film resistors deposited on a ceramic substrate on which the op amp chip is also mounted.

Figure 2:
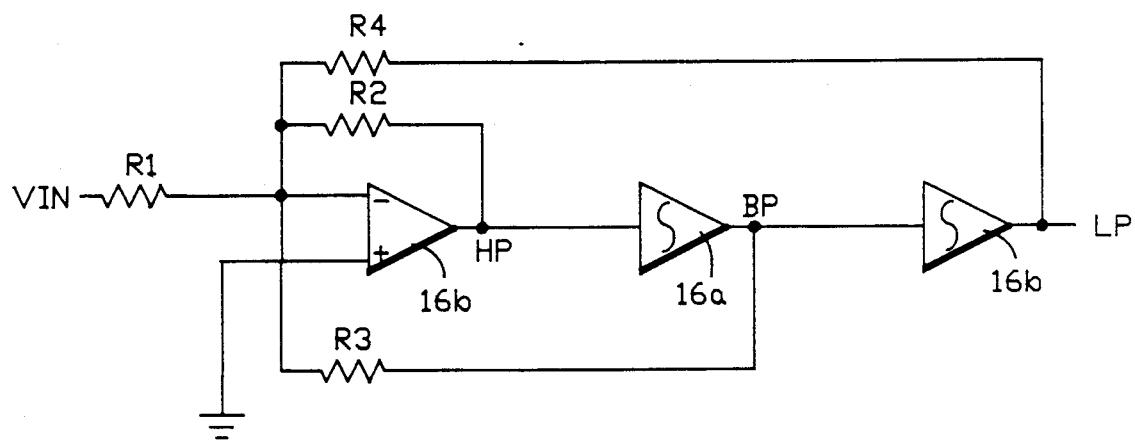
FIGS. 2 and 3 are schematics of a transformed switched capacitor filter in accordance with the prior art which is equivalent to the R-C active filter of FIG. 1.

In accordance with the '214 patent, the R-C active filter of FIG. 1 is transformed into a more versatile switched capacitor equivalent circuit as shown in FIG. 2. This circuit utilizes switched capacitors to eliminate the necessity for thin-film deposited resistors and the discrete capacitors. The active filter circuit utilizes switched capacitor positive integrators 16A and 16B along with a summing amplifier 16C.

Figure 3:
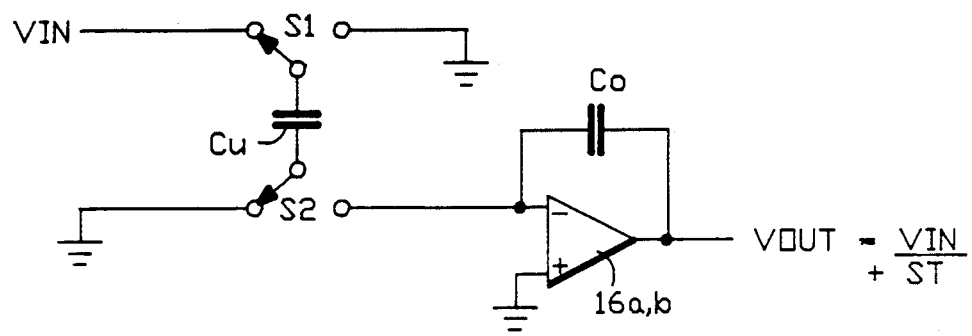

Each of the positive integrators 16A, 16B of FIG. 2 is illustrated schematically in the switched capacitor non-inverting integrator shown in FIG. 3. Each amplifier has a capacitive feedback, $C_O$, and the input to the amplifier is provided by unit capacitor $C_U$ which is alternately switched between the input terminal, $V_{in}$, and ground to ground and the input of the amplifier through switches S1 and S2. The switches S1 and S2 toggle at a frequency, Fclk.

The characteristics frequency (also called "center frequency") of the circuit of FIG. 1 is $$f_0 = \frac{1}{2\pi RC} \cdot \sqrt{R3/R4}$$

and the characteristic frequency of the circuit of FIG. 2 is $$f_0 = \frac{fCLK}{2\pi C_0/C_U} \cdot \sqrt{R2/R4}$$

The approximation of the circuit of FIG. 2 to the circuit of FIG. 1 increases as the ratio of $C_O/C_U$ increases. As the ratio of $C_O/C_U$ increases, the time domain filter of FIG. 2 more closely approximates an equivalent continuous time RC active filter.

The switched capacitor integrator of FIG. 3 charges the unit capacitor, CU, through switches S1 and S2 which introduce some resistance into the input circuit, as illustrated in FIG. 4. High filter characteristic frequencies imply high clock frequencies, Fclk, and therefore less time available to charge and discharge the unit capacitor via the ON resistance of the switches S1, S2. With an infinitely fast-settling operational amplifier, the speed of the filter is limited by the RC time constant of capacitor $C_U$ and the switch resistances. Decreasing the value of capacitors $C_U$ and $C_O$ would provide smaller time constants; however, this degrades the DC performance of the filter as well as the parasitic clock feedthrough performance, and increases the wideband noise of the circuit.

The quality factor, Q, of the filter of FIG. 2 is expressed by $$Q = R3/R2 \cdot \sqrt{R2/R4}$$

For a given center frequency $$fo = \frac{fCLK}{2\pi C_0/C_U} \cdot \sqrt{R2/R4}$$

A high value of Q implies a large resistor R3. However, if the resistors of FIG. 2 were included on the chip, the large values of R3 would be cumbersome.

The switched capacitor integrator circuitry of FIG. 4 can be redrawn as shown in FIG. 5 in which the capacitor $C_U$ is replaced by two capacitors, $C_U/2$, connected in parallel. The circuit of FIG. 5 has an equivalent function except the time constant in charging the sampling capacitors is halved.

In accordance with the present invention, the input circuitry illustrated in FIG. 5 is altered to double the sampling rate as shown schematically in FIG. 6. The bottom switches are reversed (or inverted) so that the switched capacitor integrator doubles its sampling rate. Thus, input frequencies up to the clock frequency are allowed. The integrator is otherwise functionally equivalent to the circuit of FIG. 5.

FIG. 7 is one embodiment of a switched capacitor block in accordance with the invention and including summing amplifier A1 and positive integrators A2 and A3. The switched capacitor circuitry of FIG. 6 is used as the input to amplifier A2 and to amplifier A3. This building block provides a universal switched capacitor filter providing high pass, band pass, and low pass outputs. The ground nodes, 1 and 2, in the input to integrator A2 are identified for reference in the alternative embodiment illustrated in FIG. 9, infra.

Operation of the circuitry of FIG. 7 cannot be quantitatively explained by approximating the switched capacitor integrators with their continuous time RC equivalent of FIG. 2. While the double sampled switched capacitor integrator by itself can be approximated by continuous time equivalent circuit, when used in a system with multiple feedback paths as in FIG. 7 the approximation is no longer valid. The major difference is a non-linear relation between the value of the quality coefficient, Q, and the value of the feedback resistors, R2 and R3. If both integrators of the filter of FIG. 2 have identical time constants, the value of the quality coefficient, Q, is $$Q = \frac{R3}{R2} \cdot \sqrt{R2/R4}$$

As the value of R3 increases, so does the value of the quality coefficient, Q. The value of the quality coefficient of the circuit of FIG. 7 can be closely approximated by:

$$Q \approx \frac{1.005 \sqrt{R2/R4}}{(R2/R3) - \left(R2/R4 \cdot \frac{C_U/2}{C_0}\right)}$$

If $\frac{C_U/2}{C_0} = 1/16$ then $$Q \approx \frac{1.005 \sqrt{R2/R4}}{(R2/R3) - R2/R4 \cdot 1/16}$$

In the above equation, when the value of resistor R3 is approximately equal to $16 \times R4$, the circuit has a quality approaching infinity. Thus, high quality values required by selective circuits can be achieved by small values of resistors R3, which is desirable when R3 and the remaining resistors are monolithically integrated on the semiconductor chip.

Figure 8:
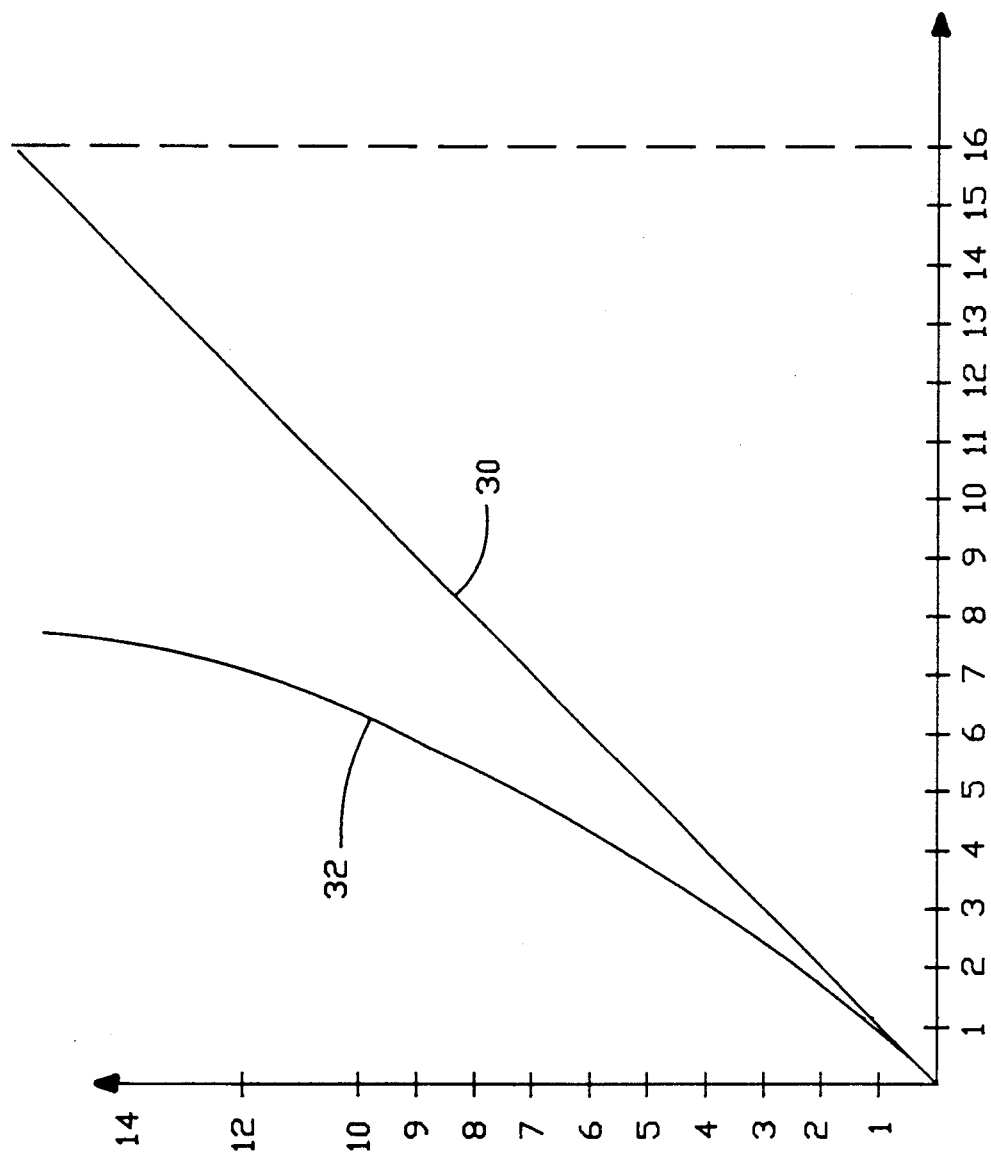
FIG. 8 is a plot of qualify coefficient, Q, versus resistive values, for prior-art filters and for a filter in accordance with the present invention.

FIG. 8 is a plot of quality coefficient versus the ratio R3/R2 for the circuit of FIG. 7. For convenience, R2/R4 is assumed equal to unity. Also shown is the quality coefficient curve for the circuit of FIG. 2. The relationship of quality of the circuit of FIG. 2 to the R3/R2 ratio is linear as shown by curve 30. On the other hand, the relationship of quality Q versus the ratio of R3/R2 for the circuit of FIG. 7 is nonlinear as shown at 32. The nonlinear curve 32 approaches infinity at an asymptote of 16 for a circuit in which the ratio of $[C_U/2]/C_O = 1/16$. For convenience, the ratio R2/R4 is assumed equal to unity. If the value of R2/R4 is different than unity, the curves of FIG. 2 become a family of curves.

Figure 9:
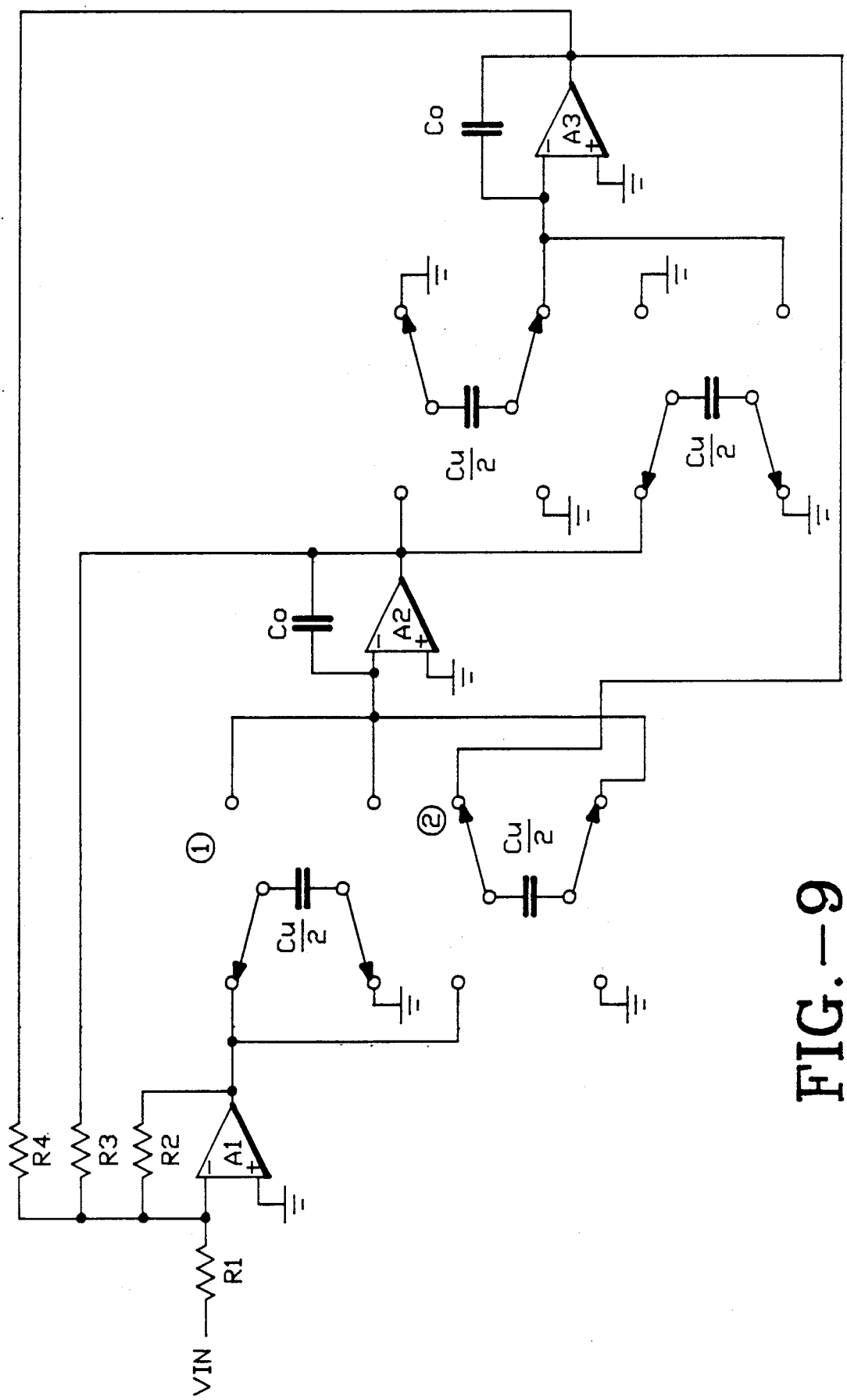
FIG. 9 is a schematic of a switched capacitor filter block in accordance with another embodiment of the invention.

FIG. 9 is a schematic of another embodiment of the switched capacitor filter in accordance with the invention which is similar to the circuitry of FIG. 7 except that the nodes 1 and 2 of FIG. 7 are connected at the output of the last integrator A3. In this design, the resonant frequency of the circuit is $$fo = \frac{fCLK}{2\pi C_0/C_U} \cdot \sqrt{1 + R2/R4}$$

where Fclk is the clock frequency toggling the switches on and off. The quality factor of the circuit is $$Q \approx \frac{1.005 \sqrt{1 + R2/R4}}{(R2/R3) - \left(R2/R4 \cdot \frac{C_U/2}{C_0}\right)}$$

Again, high values of Q can be obtained by relatively small values of resistor R3.

Figure 10:
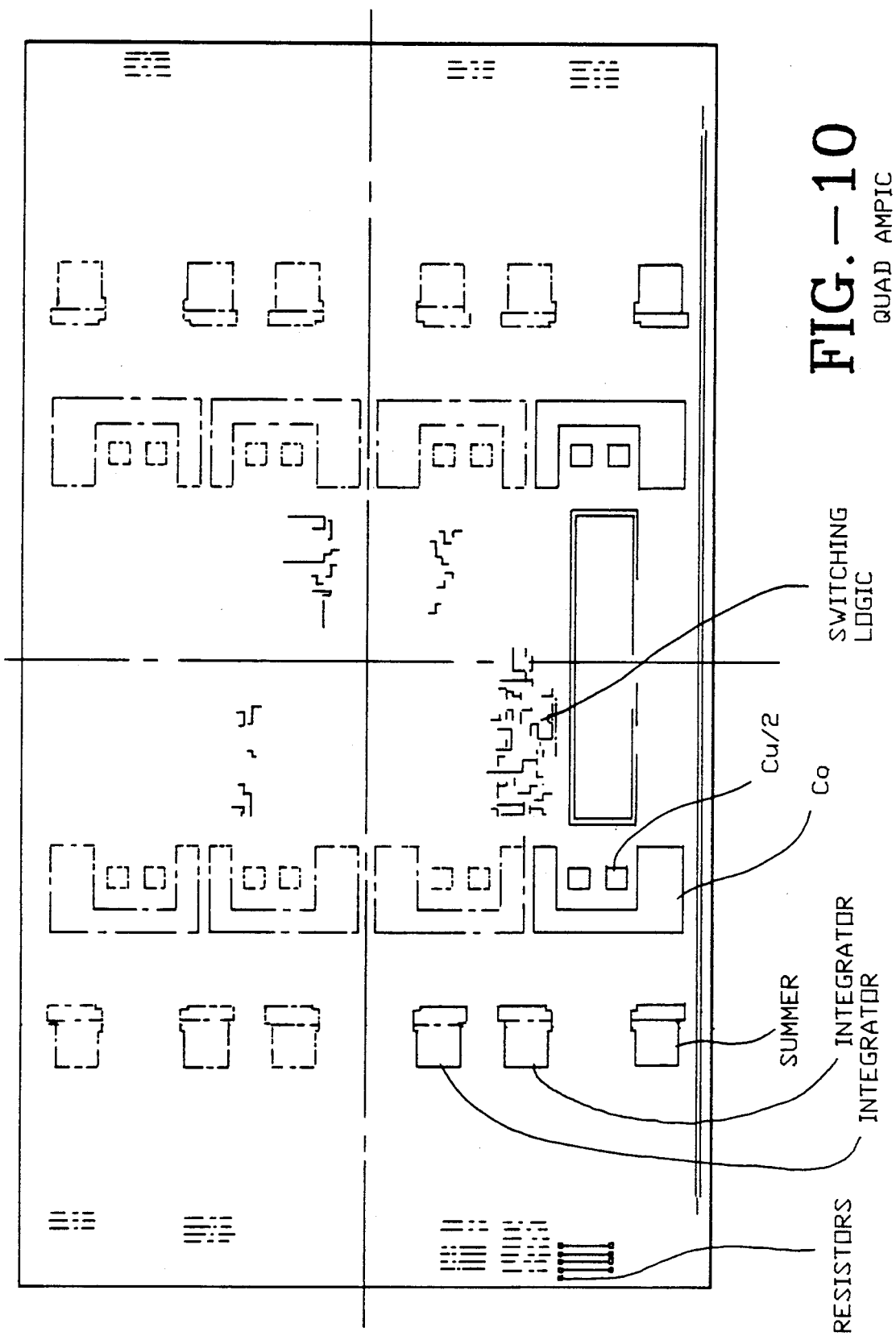
FIG. 10 is a plan view of a chip layout illustrating the location of thin-film resistors used therein.

Due to the nonlinear curve for quality Q as illustrated in FIG. 8, the accuracy of the selected resistor values is critical in establishing a desired quality value. In accordance with another feature of the invention, the resistors used in the switched capacitor filter block are thin-film (e.g. silicon chrome) resistors fabricated directly on the surface of the semiconductor chip as illustrated in the plan view of one embodiment of the circuit of FIG. 10. Such resistors are conventional in hybrid circuitry, and the resistors are formed on an insulating layer (silicon oxide, for example) on the chip surface using conventional techniques.

The switched capacitor filter block in accordance with the present invention, utilizing a double sampling rate and thin-film resistors fabricated directly on the monolithic filter semiconductor chip, permits high quality filters which can be accurately tuned. Provision of the thin-film resistors directly on the chip reduces parasitic capacitance as opposed to discrete resistors. Further, the use of thin-film resistors improves the accuracy of the selected resistance values. Moreover, since the programming of the filter with a single mask during fabrication is permitted in selectively interconnecting the resistors to the amplifiers, changes in resistance values are accomplished by tapping of the resistor elements.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

We claim:

1. A switched capacitor filter block comprising
a summing amplifier having an input and an output,
a first resistor (R2) connected between said output and said input of said summing amplifier,
a first integrator having an input and an output,
a first capacitor ($C_O$) connected between said output and said input of said first integrator,
a second resistor (R3) connected between said output of said first integrator and said input of said summing amplifier,
a first pair of capacitors ($C_U/2$) switchably connecting said output of said summing amplifier to said input of said first integrator, said first pair of capacitors being alternately connected to said output and to said input to thereby double the sampling rate of said first pair of capacitors,
a second integrator having an input and an output,
a second capacitor ($C_O$) connected between said output and said input of said second integrator,
a third resistor (R4) connected between said output of said second integrator and said input of said summing amplifier, and
a second pair of capacitors ($C_U/2$) switchably connecting said output of said first integrator to said input to said second integrator, said second pair of capacitors being alternately connected to said output and to said input to thereby double the sampling rate of said second pair of capacitors.

2. The switched capacitor filter block as described by claim 1 wherein said block is formed in a monolithic integrated circuit, said first, second and third resistors comprising thin-film resistors formed on a surface of said monolithic integrated circuit.

3. The switched capacitor filter block as described by claim 2 wherein the quality coefficient of said filter block is nonlinear with respect to the values of said first and third resistors.

4. The switched capacitor filter block as described by claim 3 wherein the quality coefficient, Q, is defined by $$Q \approx \frac{1.005 \sqrt{R2/R4}}{(R2/R3) - \left(R2/R4 \cdot \frac{C_U/2}{C_0}\right)}$$

5. The switched capacitor filter block as described by claim 3 wherein said first pair of capacitors are also switchably connected to said output of said second integrator.

6. The switched capacitor filter block as described by claim 5 wherein the quality coefficient, Q, is defined by $$Q \approx \frac{1.005 \sqrt{1 + R2/R4}}{(R2/R3) - \left(R2/R4 \cdot \frac{C_U/2}{C_0}\right)}$$

7. In a monolithic switched capacitor filter circuit fabricated in a surface of a semiconductor substrate, resistors for providing conduction paths in said filter circuit comprising a plurality of thin-film resistors fabricated on said surface of said semiconductor substrate, and means connecting lengths of said thin-film resistors in said circuit to thereby accurately establish the quality coefficient of said circuit.

8. Resistors as defined by claim 7 wherein said means connecting lengths of said thin-film resistors are metal connectors fabricated in a single metal mask step in fabricating said monolithic switched capacitor filter circuit.

9. Resistors as defined by claim 8 wherein said conductive paths are feedback paths, said resistors determining the quality factor and center frequency of said filter circuit.

* * * * *

REEXAMINATION CERTIFICATE (2712th)
United States Patent [19]
Sevastopoulos et al.

[11] B1 4,988,952
[45] Certificate Issued Oct. 31, 1995

[54] HIGH Q SWITCHED CAPACITOR FILTER HAVING INTERNAL THIN-FILM RESISTORS

[75] Inventors: Nello G. Sevastopoulos; Robert C. Dobkin, both of San Jose, Calif.

[73] Assignee: Linear Technology Corporation, Milpitas, Calif.

Reexamination Request:
No. 90/003,624, Nov. 7, 1994

Reexamination Certificate for:
Patent No.: 4,988,952
Issued: Jan. 29, 1991
Appl. No.: 362,144
Filed: Jun. 6, 1989

[51] Int. Cl.$^6$ ............................................. H03F 1/34
[52] U.S. Cl. ........................... 330/51; 330/107; 330/307
[58] Field of Search .............................. 330/9, 51, 107, 330/307; 328/167; 333/173

[56] References Cited

U.S. PATENT DOCUMENTS 4,417,214  11/1983  Sevastopoulos et al. .

OTHER PUBLICATIONS

Choi, et al., "Considerations for High–Frequency Switched–Capacitor Ladder Filters," *IEEE Transactions of Circuits and Systems*, Jun. 1980.
Gray, et al., "Single–chip NMOS Dual Channel Filter," *IEEE Journal of Solid–State Circuits*, vol SC–14, pp. 981–990, Dec., 1979.
Analog Devices 1988 Linear Products Databook, Analog Devices Corporation, 1988.
Frederick Emmons, "Active Filters: Lumped, Distributed, Integrated, Digital, and Parametric", McGraw–Hill Inc., 1970.
David A. Hodges, "Analog Switches and Passive Elements in MOSLSI," pp. 14–18 from Analog MOS Integrated Circuits, IEEE Press Selected Reprint Series, ISBN 0–87942–142–8, 1980.
LTC1064 data sheet, Linear Technology Corporation, Mar. 1988 (copy of document, already of record, enclosed).
Paul R. Gray and Robert G. Meyer, "Analysis and Design of Analog Integrated Circuits," pp. 116, 117, John Wiley & Sons, 1977.

*Primary Examiner*—James B. Mullins

[57] ABSTRACT

Disclosed is a switched capacitor filter block having a nonlinear quality coefficient, Q, whereby quality can be enhanced while limiting the size of feedback resistors in the filter block. A pair of capacitors alternately switchably connect an input signal to the input of integrator whereby the sampling frequency is twice the switching frequency. The filter block is readily fabricated in a monolithic integrated circuit with the feedback resistors being thin-film resistors formed on the surface of the monolithic integrated circuit. Such a circuit configuration is more accurate in programming and requires only one mask step in fabrication to program.

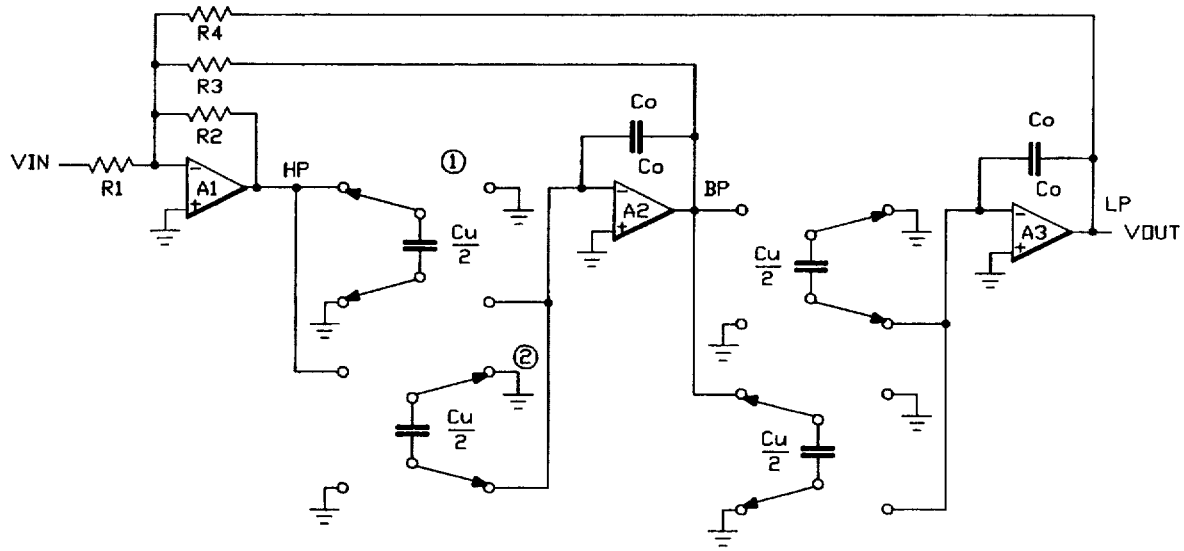

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3, 4 and 7 are determined to be patentable as amended.

Claims 2, 5, 6, 8 and 9, dependent on an amended claim, are determined to be patentable.

New claims 10-15 are added and determined to be patentable.

1. A switched capacitor filter block comprising a summing amplifier having an input and an output, a first resistor (R2) connected between said output and said input of said summing amplifier, a first integrator having an input and an output, a first capacitor ($C_O$) connected between said output and said input of said first integrator, a second resistor (R3) connected between said output of said first integrator and said input of said summing amplifier, a first pair of capacitors ($C_U/2$) switchably connecting said output of said summing amplifier to said input of said first integrator, said first pair of capacitors being alternately connected to said output and to said input to thereby double the sampling rate of said first pair of capacitors, a second integrator having an input and an output, a second capacitor ($C_O$) connected between said output and said input of said second integrator, a third resistor (R4) connected between said output of said second integrator and said input of said summing amplifier[,] *wherein value of said second resistor (R3) is selected based upon a predefined function of value of said third resistor (R4) in order to establish a desired value of a quality coefficient (Q) of said switched capacitor filter block,* and a second pair of capacitors ($C_U/2$) switchably connecting said output of said first integrator to said input to said second integrator, said second pair of capacitors being alternately connected to said output and to said input to thereby double the sampling rate of said second pair of capacitors.

3. The switched capacitor filter block as described by claim 2 wherein the quality coefficient of said filter block is nonlinear with respect to the values of said first and third resistors, *and wherein said predefined function is related to capacitances of said second capacitor ($C_O$) and of said first pair of capacitors ($C_U/2$)*.

4. The switched capacitor filter block as described by claim 3 wherein *value of said second resistor (R3) is made equivalent to the product of* $(C_O)/(C_U/2)$ *and R4 so as to maximize the following expression for* the quality coefficient, Q, [is defined by]

$$Q = \frac{1.005\sqrt{R2/R4}}{(R2/R3) - \left(R2/R4 \cdot \frac{C\mu/2}{C_0}\right)}.$$

7. In a monolithic switched capacitor filter circuit *having at least one double-sampled switched capacitor integrator, said circuit exhibiting a quality coefficient which is a nonlinear function of a resistance ratio of the values of first and second resistors coupled to said integrator wherein values of doubled-sampled switched capacitors also coupled to said integrator are selected in order to cause said nonlinear function to approach a maximum for a specific value of said resistance ratio, said circuit being* fabricated in a surface of a semiconductor substrate[, resistors for providing conduction paths in said filter circuit comprising] *wherein said resistors comprise* a plurality of thin-film resistors fabricated on said surface of said semiconductor substrate, and means connecting lengths of said thin-film resistors in said circuit *in order* to [thereby] adjust said values of said resistors *as necessary* to accurately establish *a desired value of* the quality coefficient of said circuit *in accordance with said nonlinear function*.

10. The switched capacitor filter block of claim 1 wherein said predefined function is dependent upon the capacitance ratio $(C_O)/(C_U/2)$.

11. The switched capacitor filter block of claim 1 wherein said predefined function is equivalent to the product of the capacitance ratio $(C_O)/(C_U/2)$ and the value of said third resistor R4.

12. A switched capacitor filter block comprising:

a summing amplifier having an input and an output, a first resistor (R2) connected between said output and said input of said summing amplifier, a first integrator having an input and an output, a first capacitor ($C_O$) connected between said output and said input of said first integrator, a second resistor (R3) connected between said output of said first integrator and said input of said summing amplifier, a first pair of capacitors ($C_U/2$) switchably connecting said output of said summing amplifier to said input of said first integrator, said first pair of capacitors being alternately connected to said output and to said input to thereby double the sampling rate of said first pair of capacitors, a second integrator having an input and an output, a second capacitor ($C_O$) connected between said output and said input of said second integrator, a third resistor (R4) connected between said output of said second integrator and said input of said summing amplifier wherein a desired value of a quality coefficient of said circuit is achieved by selecting value of said second resistor (R3) in accordance with a predefined function of value of said third resistor (R4), value of at least one of said first and second capacitors ($C_O$), and value of at least one of said first pair of capacitors ($C_U/2$), a second pair of capacitors ($C_U/2$) switchably connecting said output of said first integrator to said input to said second integrator, said second pair of capacitors ($C_U/2$) being alternately connected to said output and to said input to thereby double the sampling rate of said second pair of capacitors.

13. The switched capacitor filter block of claim 12 wherein said predefined function is proportional to the product of the value of said third resistor (R4) and the capacitance ratio $(C_O)/(C_U/2)$.

14. In a monolithic switched capacitor filter circuit having first and second double-sampled switched capacitor integrators and a plurality of positive feedback paths coupled thereto, said positive feedback paths being defined by a corresponding plurality of feedback resistors wherein value of at least one of said feedback resistors is selected in accordance with a predefined nonlinear function related to capacitance of said double-sampled switched capacitor integrators in order that said circuit be characterized by a desired quality coefficient, Q, said circuit being fabricated in a surface of a semiconductor substrate wherein said feedback resistors comprise a plurality of thin-film resistors fabricated on said surface of said semiconductor substrate, and means connecting lengths of said thin-film resistors in said circuit so as to adjust said values of said resistors as necessary to accurately establish the desired quality coefficient of said circuit.

15. The switched capacitor filter block of claim 12 wherein said first pair of capacitors $(C_U/2)$ are also switchably connected to said output of said second integrator.

* * * * *